United States Patent
Kanazawa et al.

(10) Patent No.: US 11,698,426 B2
(45) Date of Patent: Jul. 11, 2023

(54) MAGNETIC RESONANCE IMAGING APPARATUS AND IMAGING MANAGEMENT METHOD

(71) Applicant: Canon Medical Systems Corporation, Otawara (JP)

(72) Inventors: Hitoshi Kanazawa, Utsunomiya (JP); Seiji Nozaki, Otawara (JP); Takehiro Shibuya, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 17/453,679

(22) Filed: Nov. 5, 2021

(65) Prior Publication Data
US 2022/0146610 A1 May 12, 2022

(30) Foreign Application Priority Data
Nov. 9, 2020 (JP) .................. 2020-186602

(51) Int. Cl.
*G01R 33/3815* (2006.01)
*G01R 33/38* (2006.01)
*H01F 6/04* (2006.01)
*H01F 6/02* (2006.01)
*G01R 33/54* (2006.01)

(52) U.S. Cl.
CPC ..... *G01R 33/3815* (2013.01); *G01R 33/3804* (2013.01); *G01R 33/543* (2013.01); *H01F 6/02* (2013.01); *H01F 6/04* (2013.01)

(58) Field of Classification Search
CPC ............ G01R 33/3815; G01R 33/3804; G01R 33/543; G01R 33/48; H01F 6/02; H01F 6/04; A61B 5/055; A61B 5/0033
See application file for complete search history.

(56) References Cited

U.S. PATENT DOCUMENTS

| | | | |
|---|---|---|---|
| 8,058,873 B2 | 11/2011 | Timinger | |
| 8,593,145 B2 | 11/2013 | Van Der Koijk et al. | |
| 2014/0232402 A1* | 8/2014 | Tsuda | G01R 33/389 324/309 |
| 2022/0146607 A1* | 5/2022 | Kanazawa | G01R 33/546 |
| 2022/0146611 A1* | 5/2022 | Nakabayashi | H01F 6/04 |

OTHER PUBLICATIONS

Lvovsky et al., "Novel technologies and configurations of superconducting magnets for MRI", Superconductor Science and Technology 26, 093001, 2013, 72 pages.
Winkler et al., "Gradient and shim technologies for ultra high field MRI", Neuroimage, vol. 168, 2018, 32 pages.

* cited by examiner

*Primary Examiner* — G. M. A Hyder
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry is configured to calculate an allowable amount of heat input to a superconducting magnet, the allowable amount being allocated to each of a plurality of imagings scheduled during a target period. The processing circuitry is configured to determine an imaging condition based on the allowable amount in the each of the plurality of imagings.

19 Claims, 9 Drawing Sheets

| Allowable amount | 5.0 [kJ] |
| --- | --- |
| Desired imaging condition | 3.0 [kJ] |
| Fill rate | 60 [%] |

MAGNETIC RESONANCE IMAGING APPARATUS AND IMAGING MANAGEMENT METHOD

CROSS-REFERENCE TO RELATED APPLICATIONS

This application is based upon and claims the benefit of priority from Japanese Patent Application No. 2020-186602, filed Nov. 9, 2020, the entire contents of which are incorporated herein by reference.

FIELD

Embodiments described herein relate generally to a magnetic resonance imaging apparatus and an imaging management method.

BACKGROUND

A superconducting magnetic resonance imaging apparatus (superconducting MRI apparatus) uses, for example, helium as a refrigerant for a superconducting coil. However, the recent steep rise in helium prices has put pressure on lifetime costs of an MRI apparatus. Therefore, it is desirable to adopt a low-capacity refrigerant in which a helium capacity is made as small as possible.

The recent attention to low-capacity refrigerants creates the need to consider a phenomenon in which the application of a gradient field in imaging causes an induced current in, for example, a superconducting coil inside a superconducting magnet, thereby resulting in an increased temperature inside the superconducting magnet (Gradient Coil Induced Heating: GCIH). That is, in an MRI apparatus with a large capacity of helium and a sufficient amount of refrigerant there is a high probability that generated heat can be absorbed by evaporation of the refrigerant even with an increase in temperature of a superconducting coil. However, an MRI apparatus with a small amount of refrigerant such as an MRI apparatus adopting a low-capacity refrigerant cannot cope with the rapid increase in GCIH due to imaging, thereby increasing the possibility that quenching will be caused by heat intruding from the outside world.

For this reason, a conventional technique predicts a behavior of a magnet regarding quenching for each imaging at a stage of performing the imaging, and halts the imaging before it is actually performed if the risk of quenching is high. The risk of quenching is judged for each imaging. This causes a problem wherein the first imaging can be performed under a favorable condition; however, if the first imaging is performed under a favorable condition, as more imagings are performed, an imaging condition becomes severer, so that an imaging with a required quality can no longer be obtained.

DETAILED DESCRIPTION

In general, according to one embodiment, a magnetic resonance imaging apparatus includes processing circuitry. The processing circuitry is configured to calculate an allowable amount of heat input to a superconducting magnet, the allowable amount being allocated to each of a plurality of imagings scheduled during a target period. The processing circuitry is configured to determine an imaging condition based on the allowable amount in the each of the plurality of imagings.

A magnetic resonance imaging apparatus (MRI apparatus) and an imaging management method according to a present embodiment will be described with reference to the accompanying drawings. The description of the embodiments will assume that the components or portions having the same reference signs are adapted to operate in the same manner, and redundant explanations will be omitted as appropriate.

Figure 1:
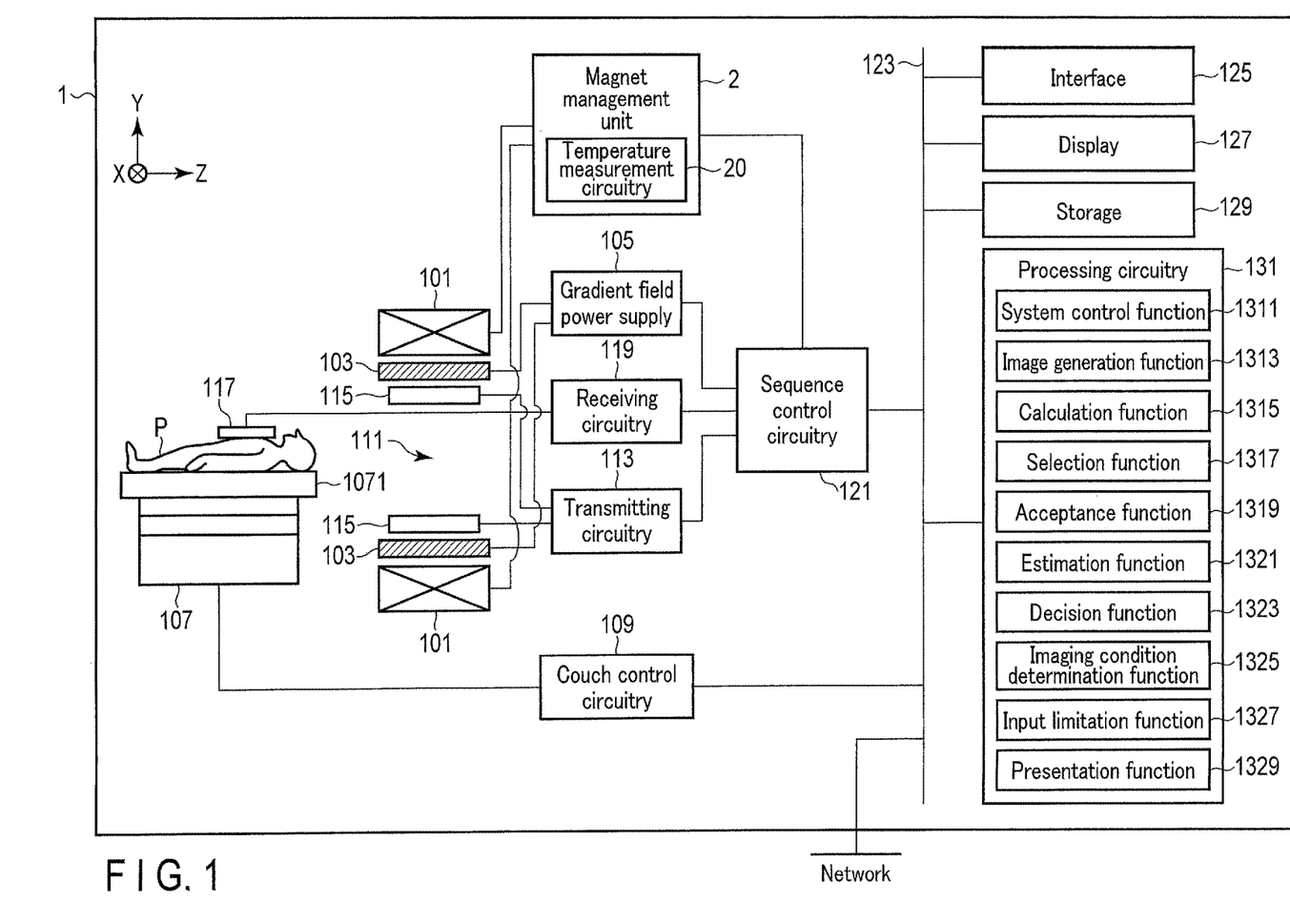
FIG. 1 is a conceptual diagram showing an MRI apparatus according to a present embodiment.

FIG. 1 is a conceptual diagram showing an MRI apparatus according to a present embodiment.

As shown in FIG. 1, an MRI apparatus 1 includes a static magnetic field magnet 101, a magnet management unit 2, a gradient field coil 103, a gradient field power supply 105, a couch 107, couch control circuitry 109, transmitting circuitry 113, a transmitter coil 115, a receiver coil 117, receiving circuitry 119, sequence control circuitry 121, a bus 123, an interface 125, a display 127, a storage 129, and processing circuitry 131. The MRI apparatus 1 may include a hollow, cylindrical-shaped shim coil provided between the static magnetic field magnet 101 and the gradient field coil 103.

The static magnetic field magnet 101 is a magnet formed in a hollow, approximately cylindrical shape. The static magnetic field magnet 101 is not necessarily in an approximately cylindrical shape; it may be formed in an open shape. The static magnetic field magnet 101 generates a uniform static magnetic field in its inner space. In the present embodiment, the static magnetic field magnet 101 is assumed to be a superconducting magnet using a superconducting coil.

The gradient field coil 103 is a coil formed in a hollow, approximately cylindrical shape. The gradient field coil 103 is arranged inside the static magnetic field magnet 101. The gradient field coil 103 is formed by combining three coils respectively corresponding to the X axis, the Y axis, and the Z axis, which are orthogonal to each other. The Z axis direction is defined as the same as the direction of the static magnetic field. In addition, the Y-axis direction is a vertical direction, and the X-axis direction is a direction perpendicular to each of the Z axis and the Y axis. Each of the three coils of the gradient field coil 103 receives a current from the gradient field power supply 105 and generates a gradient field in which the magnetic field intensity changes along a corresponding one of the X axis, the Y axis, and the Z axis.

The gradient fields along the X axis, the Y axis, and the Z axis generated by the gradient field coil 103 respectively form, for example, a gradient field for frequency encoding (also referred to as a readout gradient field), a gradient field for phase encoding, and a gradient field for slice selection. The gradient field for frequency encoding is used to change a frequency of an MR signal in accordance with a spatial position. The gradient field for phase encoding is used to change a phase of an MR signal in accordance with a spatial position. The gradient field for slice selection is used to determine an imaging cross section.

The gradient field power supply 105 is a power supply device that supplies a current to the gradient field coil 103 under the control of the sequence control circuitry 121.

The couch 107 is a device having a couch top 1071 on which a subject P is placed. The couch 107 inserts the couch top 1071 on which the subject P is placed into a bore 111 under the control of the couch control circuitry 109. The couch 107 is installed in an examination room in which the MRI apparatus 1 is installed, in such a manner that the longitudinal axis of the couch 107 is parallel to the central axis of the static magnetic field magnet 101.

The couch control circuitry 109 is circuitry that controls the couch 107, and drives the couch 107 in response to an operator's instructions via the interface 125 to move the couch top 1071 in the longitudinal direction and the vertical direction.

The transmitter coil 115 is an RF coil arranged inside the gradient field coil 103. Upon receipt of a radio frequency (RF) pulse supplied from the transmitting circuitry 113, the transmitter coil 115 generates a transmit RF wave corresponding to a high frequency magnetic field. The transmitter coil 115 is, for example, a whole body coil. The whole body coil may be used as a transmitter and receiver coil. A cylindrical RF shield is arranged between the whole body coil and the gradient field coil 103 to magnetically separate these coils.

The transmitting circuitry 113 supplies an RF pulse corresponding to Larmor frequency, etc., to the transmitter coil 115 under the control of the sequence control circuitry 121.

The receiver coil 117 is an RF coil provided inside the gradient field coil 103. The receiver coil 117 receives MR signals emitted from the subject P through a high-frequency magnetic field. The receiver coil 117 outputs the received MR signals to the receiving circuitry 119. The receiver coil 117 is a coil array including, for example, one or more, typically, a plurality of coil elements. The receiver coil 117 is, for example, a phased array coil.

The receiving circuitry 119 generates, under the control of the sequence control circuitry 121, a digital MR signal which is digitized complex number data, based on an MR signal output from the receiver coil 117. Specifically, the receiving circuitry 119 performs various types of signal processing to an MR signal output from the receiver coil 117, and then executes analog-to-digital (A/D) conversion on data to which the various types of signal processing has been performed. The receiving circuitry 119 samples the A/D-converted data. In this manner, the receiving circuitry 119 generates a digital MR signal (hereinafter, referred to as MR data). The receiving circuitry 119 outputs the generated MR data to the sequence control circuitry 121.

The sequence control circuitry 121 controls the gradient field power supply 105, the transmitting circuitry 113, and the receiving circuitry 119, etc. in accordance with an examination protocol output from the processing circuitry 131, and performs an imaging on the subject P. The examination protocol has various types of pulse sequences (also referred to as imaging sequences) in accordance with the examination. The examination protocol defines the magnitude of a current supplied from the gradient field power supply 105 to the gradient field coil 103, a timing of the supply of the current from the gradient field power supply 105 to the gradient field coil 103, the magnitude of an RF pulse supplied from the transmitting circuitry 113 to the transmitter coil 115, a timing when the RF pulse is supplied from the transmitting circuitry 113 to the transmitter coil 115, and a timing when the MR signal is received by the receiver coil 117, etc.

The bus 123 is a transmission path for transmitting data between the interface 125, the display 127, the storage 129, and the processing circuitry 131. The bus 123 may be connected via, for example, a network to various physiological signal measuring devices, an external storage, and various modalities. For example, the bus is connected to an electrocardiograph (not shown) as a physiological signal measuring device.

The interface 125 includes circuitry that receives various instructions and information inputs by an operator. The interface 125 includes circuitry relating to, for example, a pointing device such as a mouse, or an input device such as a keyboard. The circuitry included in the interface 125 is not limited to circuitry relating to a physical operational component, such as a mouse or a keyboard. For example, the interface 125 may include an electrical signal processing circuitry which receives an electrical signal corresponding to an input operation from an external input device provided separately from the MRI apparatus 1 and outputs the received electrical signal to various circuitry.

The display 127 displays, for example, various types of magnetic resonance (MR) images generated through an image generation function 1313, and various types of information relating to an imaging and image processing, under the control of a system control function 1311 in the processing circuitry 131. The display 127 is, for example, a CRT display, a liquid crystal display, an organic EL display, an LED display, a plasma display, or any other display or a monitor known in this technical field.

The storage 129 stores, for example, MR data filled in a k-space through the image generation function 1313, and image data generated through the image generation function 1313. The storage 129 stores, for example, various types of examination protocols, imaging conditions including a plurality of imaging parameters that define examination protocols, and the like. The storage 129 stores programs corresponding to various functions implemented by the processing circuitry 131. The storage 129 is, for example, a semiconductor memory element such as a random access memory (RAM), a flash memory, etc., a hard disk drive, a solid state drive, or an optical disk. The storage 129 may also be, for example, a driver that reads and writes various types of information on a portable storage medium such as a CD-ROM drive, a DVD drive, a flash memory, etc.

The magnet management unit 2 includes a temperature measurement circuitry 20.

The temperature measurement circuitry 20 measures, using a temperature sensor, the temperature of one or more superconducting coils forming the static magnetic field magnet 101 that generates a static magnetic field.

The processing circuitry 131 includes, as hardware resources, a processor and a memory such as a read-only memory (ROM), a RAM, etc. (not shown), and collectively controls the MRI apparatus 1. The processing circuitry 131 includes the system control function 1311, the image generation function 1313, a calculation function 1315, a selection function 1317, an acceptance function 1319, an estimation function 1321, a decision function 1323, an imaging condition determination function 1325, an input limitation function 1327, and a presentation function 1329.

Various functions of the processing circuitry 131 are stored in the storage 129 in a form of a program executable by a computer. The processing circuitry 131 is a processor that reads a program corresponding to each function from the storage 129 and executes the program to realize the function corresponding to the program. In other words, the processing circuitry 131 that has read each program includes, for example, a plurality of functions shown in the processing circuitry 131 in FIG. 1.

FIG. 1 illustrates the case in which various functions are realized in the single processing circuitry 131; however, the processing circuitry 131 may be constituted by a combination of a plurality of independent processors, and the functions, may be realized by the processors executing the programs. In other words, each of the above-mentioned functions may be configured as a program, and executed by a single processing circuit; alternatively, a specific function may be implemented in dedicated independent program-execution circuitry.

The term "processor" used in the above description refers to, for example, circuitry such as a central processing unit (CPU), a graphics processing unit (GPU), an application specific integrated circuit (ASIC), a programmable logic device such as a simple programmable logic device (SPLD), a complex programmable logic device (CPLD), or a field programmable gate array (FPGA), etc.

The processor reads and executes a program stored in the storage 129 to implement the corresponding function. A program may be incorporated directly in circuitry of the processor, instead of being stored in the storage 129. In this case, the processor reads and executes a program integrated into the circuitry to realize the corresponding function. Similarly, each of the couch control circuitry 109, the transmitting circuitry 113, the receiving circuitry 119, and the sequence control circuitry 121, etc. is also configured as electronic circuitry such as the above-described processor.

The processing circuitry 131 controls the MRI apparatus 1 through the system control function 1311. Specifically, the processing circuitry 131 reads a system control program stored in the storage 129 and loads it into the memory, thereby controlling each circuitry of the MRI apparatus 1 in accordance with the loaded system control program. For example, the processing circuitry 131 reads an examination protocol from the storage 129 through the system control function 1311, based on the imaging condition input by an operator via the interface 125. The processing circuitry 131 may generate the examination protocol based on the imaging condition. The processing circuitry 131 transmits the examination protocol to the sequence control circuitry 121, thereby controlling imagings with respect to the subject P.

The processing circuitry 131 applies, through the system control function 1311, an excitation pulse in accordance with an excitation pulse sequence, thereby exerting control in such a manner as to apply a gradient field. After execution of the excitation pulse sequence, the processing circuitry 131 acquires, through the system control function 1311, a MR signal from the subject P in accordance with a data acquisition sequence which is a pulse sequence for acquisition of various types of data, thereby generating MR data.

The processing circuitry 131 fills MR data along a readout direction of the k-space in accordance with the intensity of a readout gradient field through the image generation function 1313. The processing circuitry 131 generates an MR image by executing a Fourier transform on the MR data filled in the k-space. For example, the processing circuitry 131 can generate an absolute value (magnitude) image from complex MR data. Furthermore, the processing circuitry 131 can generate a phase image using real-part data and imaginary-part data in complex MR data. The processing circuitry 131 outputs an MR image such as an absolute value image and a phase image to the display 127 or the storage 129.

The processing circuitry 131 calculates, through the calculation function 1315, the allowable amount of heat input to the superconducting magnet, which is allocated to each of the imagings scheduled during a target period.

The processing circuitry 131 selects an imaging sequence through the selection function 1317.

The processing circuitry 131 accepts, through the acceptance function 1319, a desired imaging condition, which is an imaging condition desired by an operator of the MRI apparatus 1.

The processing circuitry 131 estimates, through the estimation function 1321, the feature amount relating to heat input to the superconducting magnet in a case where an imaging is performed under the desired imaging condition. The processing circuitry 131 estimates, through the estimation function 1321, a limit imaging condition which is a limit of imaging conditions.

The processing circuitry 131 determines, through the decision function 1323, whether or not to execute an imaging, whether or not imagings in a target period have been completed, and so on.

The processing circuitry 131 determines, through the imaging condition determination function 1325, an imaging condition based on the allowable amount in each imaging.

The processing circuitry 131 limits, through the input limitation function 1327, input values of an imaging parameter relating to an imaging condition desired by an operator.

The processing circuitry 131 transmits information to the operator by presenting the allowable amount on the display 127, etc., through the presentation function 1329.

Figure 2:
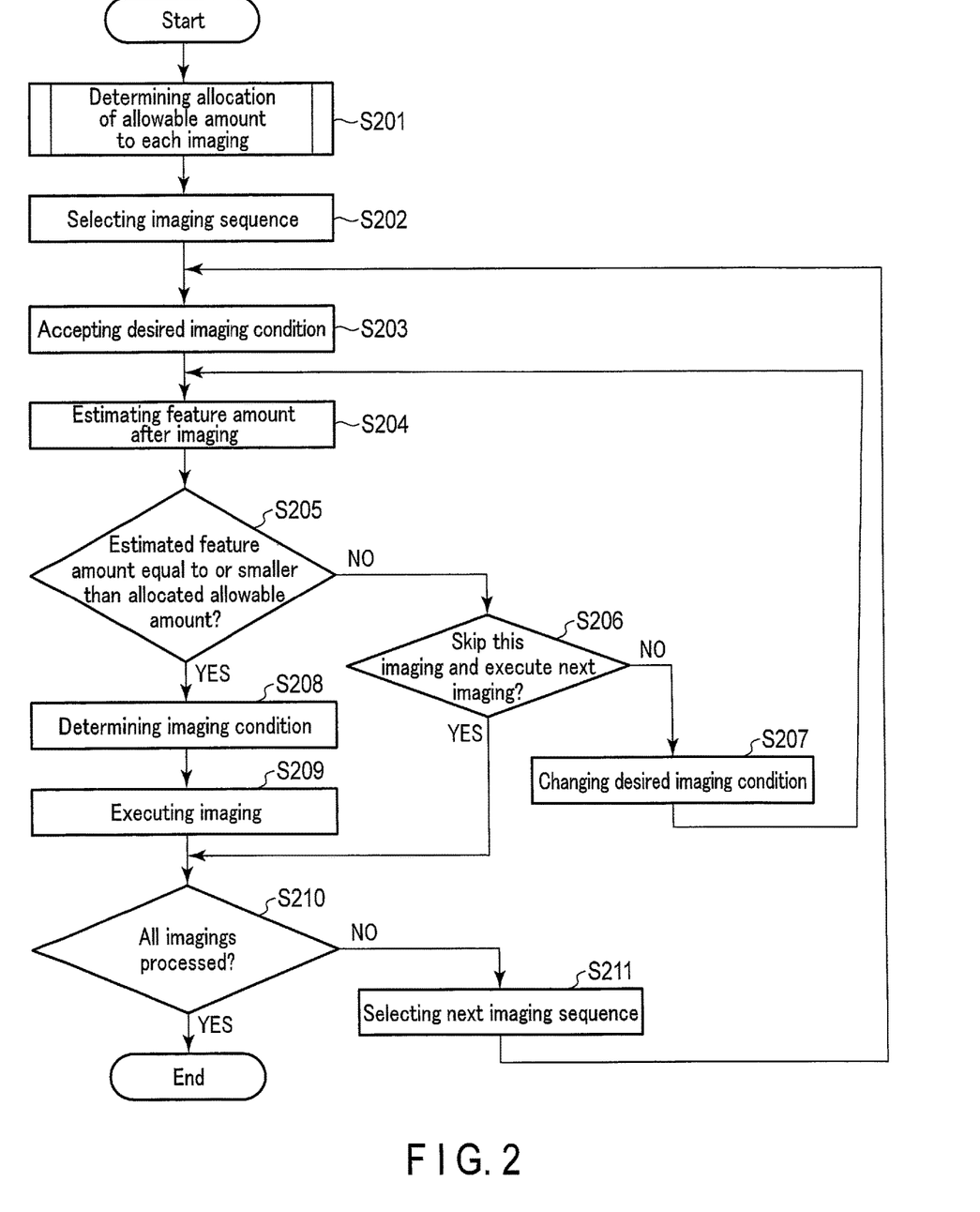
FIG. 2 is a flowchart showing imaging management processing of the MRI apparatus according to the present embodiment.

Next, an example of the imaging management processing of the MRI apparatus 1 according to the present embodiment will be described with reference to a flowchart of FIG. 2. The imaging management processing shown in the flowchart of FIG. 2 is assumed to be executed in units of, for example, imagings performed in one day or imagings performed in one week.

In step S201, the processing circuitry 131 determines, through the calculation function 1315, the allocation of the allowable amount for each imaging during a target period. The method for determining the allocation of the allowable amount will be described later with reference to FIG. 3.

In step S202, the processing circuitry 131 selects an imaging sequence through the selection function 1317. For the selection of the imaging sequence, for example, the imaging sequence may be selected according to an operator's instructions or may be automatically selected by the processing circuitry 131 according to a preset imaging schedule.

In step S203, the processing circuitry 131 accepts, through the acceptance function 1319, a desired imaging condition input by a user. In step S203, the processing circuitry 131 may set a limit based on the allowable amount, through the input limitation function 1327, on input values of an imaging parameter relating to a desired imaging condition desired by an operator. This eliminates the need to redo or reset an imaging, so that more efficient examination can be performed.

In step S204, the processing circuitry 131 estimates, through the estimation function 1321, the feature amount that is estimated in the case where an imaging is executed under the desired imaging condition acquired in step S203. Examples of the feature amount include, in the case of imaging the subject P, the amount of heat generated and the amount of temperature change in the superconducting coil, the amount of heat input to the superconducting coil, and so on.

In step S205, the processing circuitry 131 determines, through the imaging condition determination function 1325, whether or not the feature amount estimated in step S204 is equal to or smaller than the allowable amount allocated in step S201. If the estimated feature amount is greater than the allowable amount, the processing proceeds to step S206. If the estimated feature amount is equal to or smaller than the allowable amount, the processing proceeds to step S208.

In step S206, the processing circuitry 131 decides, through the decision function 1323, whether or not to execute an imaging. For example, in the case where there is an operator's input relating to resetting of a desired imaging condition, the processing circuitry 131 decides that the condition has been changed, and the processing proceeds to step S207. On the other hand, in the case where an instruction for canceling an imaging is acquired from an operator, the processing circuitry 131 decides that imaging relating to the imaging sequence acquired in step S202 is not executed (skipped), and the processing proceeds to step S210 for executing next imaging.

In step S207, the processing circuitry 131 changes the desired imaging condition through the imaging condition determination function 1325. Changing a desired imaging condition may be performed in such a manner that an instruction for changing the imaging condition may be received from an operator, and an alternative imaging condition may be automatically set by the imaging condition determination function 1325, or in such a manner that a desired imaging condition changed by the operator, for example, an imaging parameter input by the operator, may be set as a changed desired imaging condition. Thereafter, the processing returns to step S204, and the same processing is repeated.

In step S208, the processing circuitry 131 determines, through the imaging condition determination function 1325, the desired imaging condition acquired in step S203 or the desired imaging condition changed in step S207 to be an imaging condition for use in an actual imaging since the acquired or changed imaging condition is equal to or smaller than the allocated allowable amount and has a low risk of quenching, for example.

In step S209, imaging by the MRI apparatus 1 is executed based on the determined imaging condition.

In step S210, the processing circuitry 131 determines, through the decision function 1323, whether or not all imagings have been processed, in other words, whether imagings for all of the imaging sequences used to determine the allocation of the allowable amount in step S201 have been completed or not. In the case where all of the imagings have been completed, the processing is terminated. In the case where not all of the imaging are processed, the processing proceeds to step S211.

In step S211, the processing circuitry 131 selects, through the selection function 1317, an imaging sequence for the next imaging, returns to step S203, and repeats the same processing.

The imaging management processing shown in FIG. 2 enables the next and subsequent imagings to be planned even when imaging is being performed after the imaging is executed in step S208. Thus, each imaging plan may be executed before completion of the current imaging. Furthermore, since the allowable amount is allocated to each imaging in step S201, an imaging condition may be determined in advance for a plurality of imagings in a target period and thereafter the images may be executed continuously under the determined imaging condition.

Figure 3:
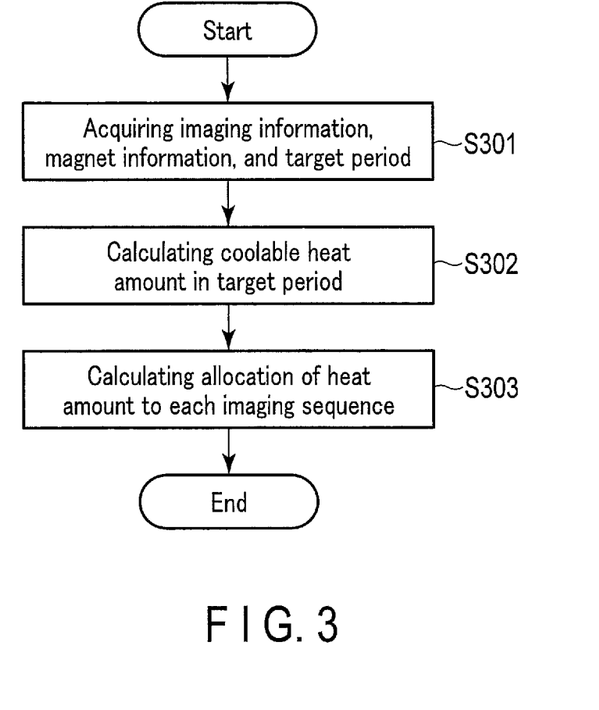
FIG. 3 is a flowchart showing details of processing of calculating the allowable amount according to the present embodiment.

Next, details of the processing of calculating the allowable amount in step S201 will be described with reference to the flowchart of FIG. 3.

In step S301, the processing circuitry 131 acquires imaging information, magnet information, and a target period through the calculation function 1315. The imaging information includes, for example, a pattern of an imaging sequence including the type of imaging (imaging sequence), the number of imagings, and a pause time. The magnet information is information on, for example, a current temperature of a static magnetic field magnet, a temperature in a thermal equilibrium state of a structure supporting the superconducting coil, a critical temperature of the static magnetic field magnet in which a quench occurs, thermal characteristics of the static magnetic field magnet, such as a thermal capacity of a coil portion, and information on a cooling capability of a refrigerator.

For a value that changes over time, such as a cooling capability of a refrigerator, information may be updated according to a long-term change in the temperature in a thermal equilibrium state during a pause in which no imaging is performed. In addition, a critical temperature of the static magnetic field magnet varies depending on the magnetic field strength of the environment in which the static magnetic field magnet is placed. Thus, the critical temperature may be determined in consideration of a position of a temperature sensor that measures the temperature of the magnetic field magnet and a result of measurement by the temperature sensor. Furthermore, in the case of using a refrigerant such as liquid helium for cooling the static magnetic field magnet, the pressure in a space filled with the refrigerant also affects the cooling capability. Thus, information on the pressure of the refrigerant, etc., may be included in the magnet information.

The target period is a period to which the allowable amount is allocated, in other words, a unit period based on which the allowable amount is calculated. It is desirable that the target period include an examination time for one patient and a pause period, such as one day or one week, for the temperature of the superconducting coil and the structure supporting the superconducting coil to return to the steady state at the time when no imaging is performed.

As the imaging information, the magnet information, and the information on a target period, the processing circuitry 131 may acquire information that is input by a user before the processing of allocating the allowable amount is executed, or may automatically acquire imaging information and a target period included in a reserved examination order stored in a radiology information system (RIS), or the like.

In step S302, the processing circuitry 131 calculates, through the calculation function 1315, the amount of coolable heat based on the imaging information, the magnet information, and the target period. For example, regarding the amount of heat that is generated by performing a plurality of preset imagings during the target period, the amount of coolable heat that can be cooled to the extent that quenching does not occur is calculated.

In step S303, the processing circuitry 131 calculates, through the calculation function 1315, based on the amount of coolable heat, the allowable amount of heat input to the superconducting magnet for each of the plurality of imaging sequences, that is, for each imaging. Specifically, for example, by dividing the amount of coolable heat by the number of imagings, an average allowable amount may be allocated to each imaging. A plurality of imaging sequences assumed herein may have the same imaging conditions or may have different imaging conditions. In the case where a plurality of imaging sequences are the same in terms of an imaging sequence type and an imaging condition, the allowable amount of heat may be made equal for each imaging.

In many cases, the amount of generated heat varies greatly depending on the imaging sequence type. Therefore, depending on the imaging sequence type, a value weighted according to the amount of generated heat in the imaging may be allocated as the allowable amount to each imaging sequence. Specifically, for example, a large amount of heat is generated by the echo planer imaging (EPI) method in which the polarity of the gradient magnetic field for reading is inverted at a high speed to collect a plurality of echo signals. Thus, for a sequence of diffusion-weighted imagings using the EPI method or for imagings using the blood oxygenation level dependent (BOLD) method of functional MRI (fMRI), the weight may be increased. Furthermore, for an examination which generates a large amount of heat, such as the EPI method, an upper limit number of times may be set within a target period. This is effective in preventing an operator from being confused and the examination efficiency from being lowered.

Furthermore, the processing circuitry 131 may calculate, through the calculation function 1315, the maximum number of imagings in a target period based on the amount of coolable heat calculated in step S302. For example, if the allowable amount of each imaging sequence that is averaged and allocated through the calculation function 1315 is equal to or smaller than a threshold value, there is a possibility that imagings will not be able to be performed while maintaining quality. Therefore, by calculating the maximum number of imagings that can be performed while maintaining quality, and presenting the calculated maximum number to an operator, the operator can be prompted to reduce the number of images in a target period.

Next, a modification of the operation of the MRI apparatus 1 according to the present embodiment will be described with reference to the flowchart of FIG. 4.

Figure 4:
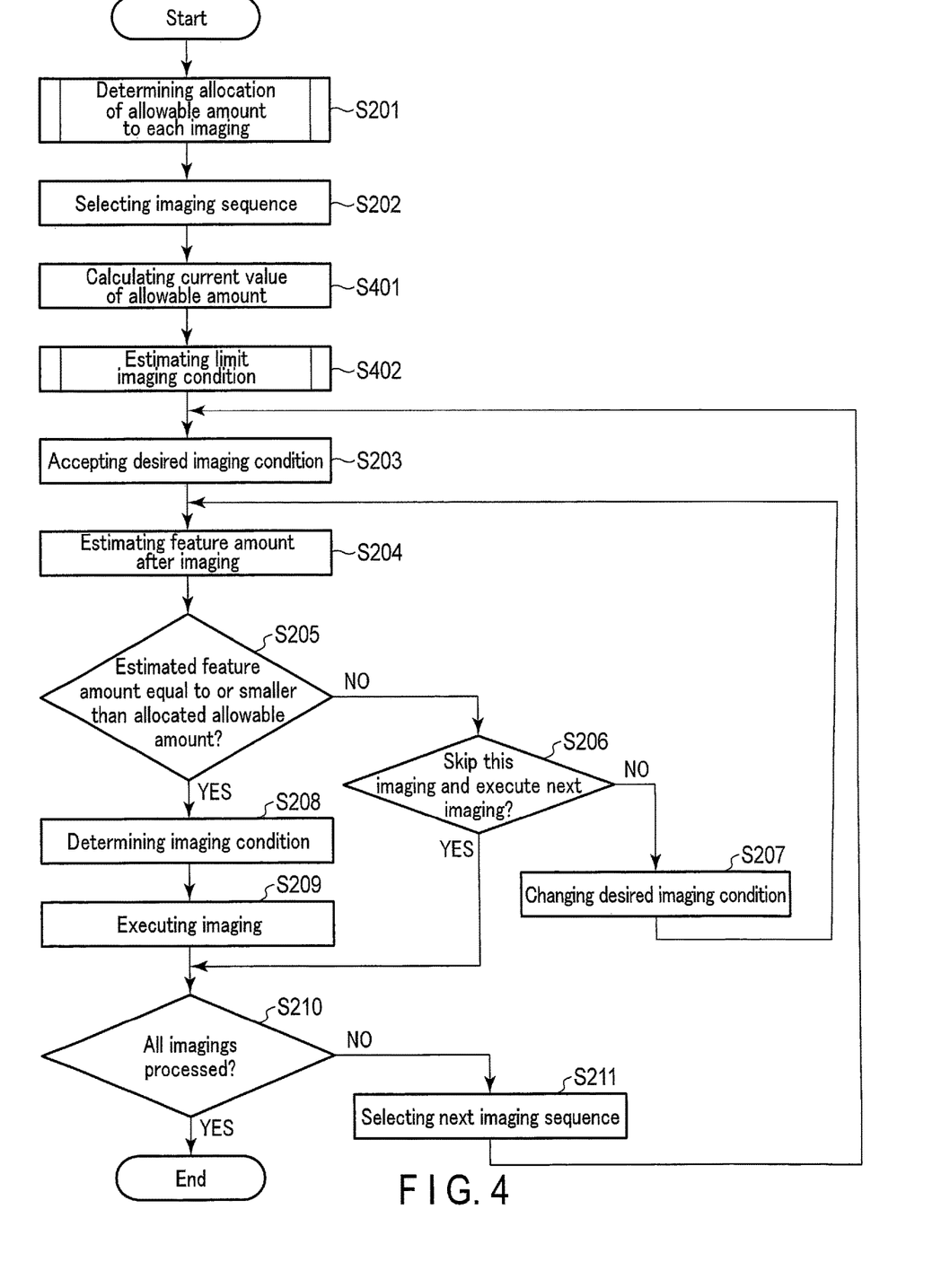
FIG. 4 is a flowchart showing imaging management processing of an MRI apparatus according to a modification of the present embodiment.

Since the flowchart shown in FIG. 4 is the same processing as in FIG. 2 except for step S401 and step S402, the description thereof will be omitted.

In step S401, the processing circuitry 131 calculates a current value of the allowable amount through the calculation function 1315. This is because, in the case of the feature amount being, e.g., a current temperature of the static magnetic field magnet that changes over time, the temperature may have changed from the time when the allowable amount is allocated in step S201. Therefore, calculating a current value of the allowable amount enables a more accurate decision of, for example, the risk of quenching due to heat input to the superconducting coil.

In step S402, the processing circuitry 131 estimates, through the estimation function 1321, based on the current value of the allowable amount, the limit imaging condition, which is the limit of imaging conditions that allow imagings in an imaging sequence acquired in step S202.

By estimating the limit imaging condition within a range that does not exceed the allowable amount, imaging conditions that can be input by an operator can be limited to those within the range that does not exceed the allowable amount. The processing from step S204 to step S208 may be executed or may be omitted. That is, since the imaging condition acquired in step S203 falls within the range that does not exceed the allowable amount, the imaging in step S209 may be executed after the processing in step S203.

In step S203, the processing circuitry 131 may set a limit, through the input limitation function 1327, on input values of an imaging parameter relating to a desired imaging condition desired by an operator, based on the limit imaging condition.

Figure 5:
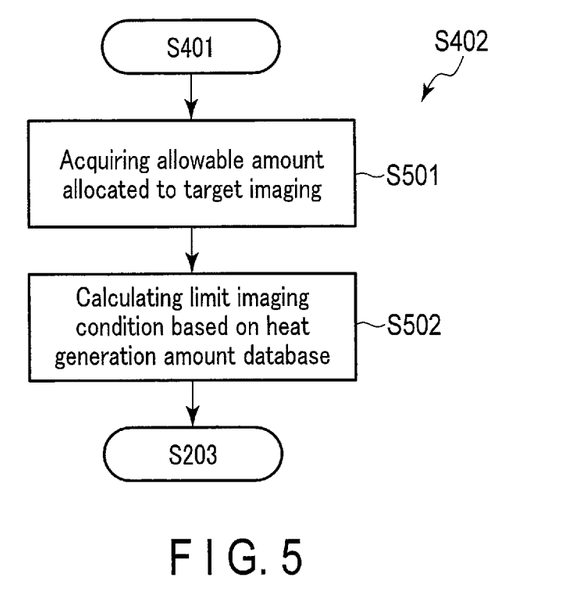
FIG. 5 is a flowchart showing details of processing of estimating a limit imaging condition according to the present embodiment.

Next, details of the processing of estimating the limit imaging condition in step S402 will be described with reference to the flowchart of FIG. 5.

In step S501, the processing circuitry 131 acquires, through the estimation function 1321, the allowable amount allocated to a target imaging sequence.

In step S502, the processing circuitry 131 calculates, through the estimation function 1321, a limit value of imaging conditions, that is, the limit imaging condition, based on a heat generation amount database. The heat generation amount database is a database that stores a correspondence relationship between the imaging condition and the amount of generated heat, and is stored in, for example, the storage 129 or an external storage. Specifically, the processing circuitry 131 calculates as the limit imaging condition, through the estimation function 1321, a limit value of imaging conditions relating to heat generation such as a repetition time (TR), a slice thickness, and spatial resolution, based on the heat generation amount database, the allowable amount acquired in step S301, and the information including the type of imaging and the cross-sectional direction.

Next, a calculation example of the amount of generated heat required for generating the heat generation amount database will be described with reference to FIG. 6.

For imaging with the MRI apparatus 1, the imaging conditions include, e.g., the type of imaging (imaging sequence), the cross-sectional direction, the TR, and the slice thickness described in the above. Various imaging conditions can be considered depending on the imaging purpose. On the other hand, since actual measurement of the amount of generated heat takes a lot of time, it is not realistic to actually measure the amount of generated heat under all the assumed imaging conditions.

Figure 6:
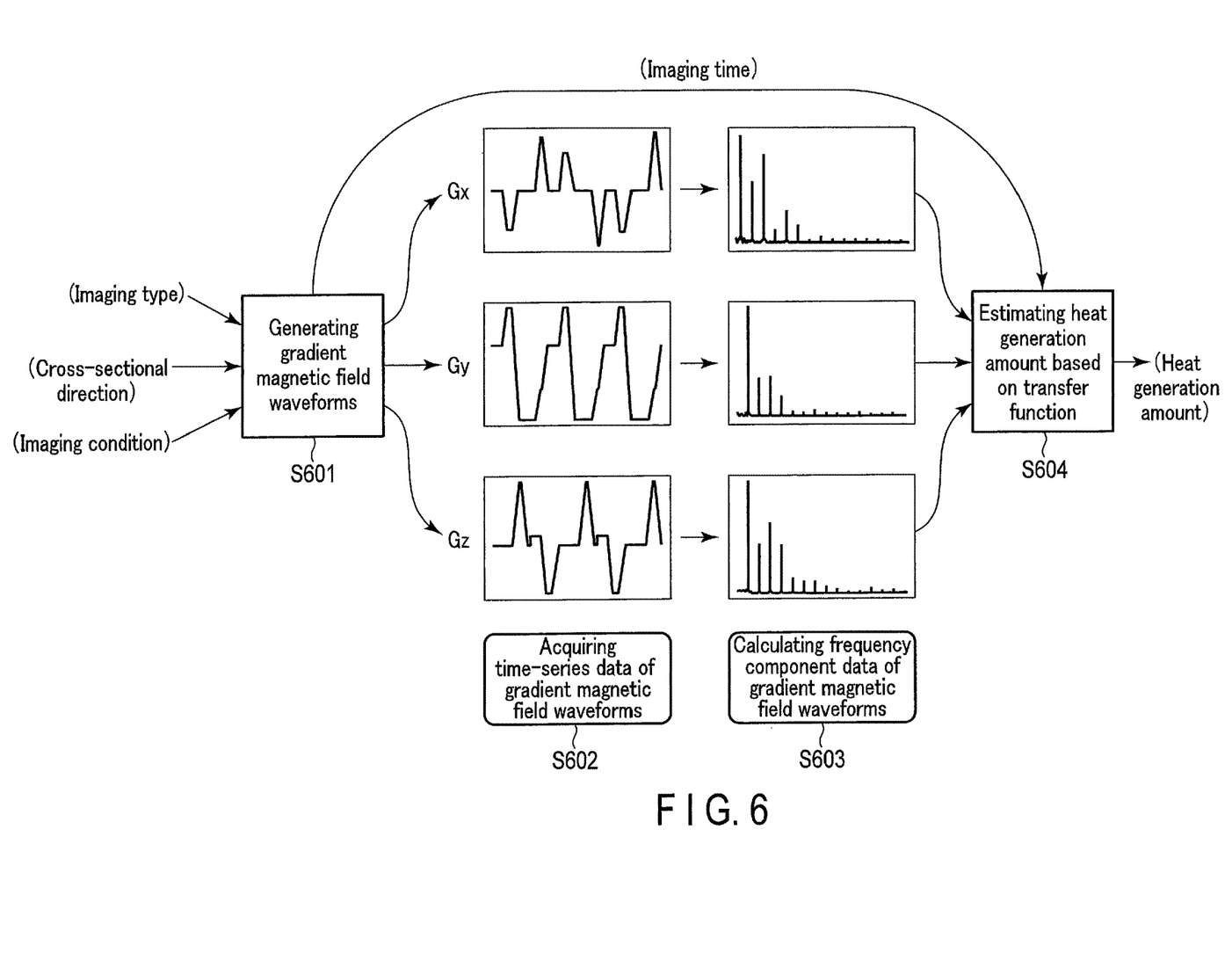
FIG. 6 is a conceptual diagram showing an example of calculating the generated heat amount required for generating a generated heat amount database according to the present embodiment.

Therefore, in step S601 shown in FIG. 6, three gradient magnetic field waveforms for the Gx, Gy, and Gz directions are generated based on the imaging conditions, such as the type of imaging method, the cross-sectional direction in imaging, the TR, and the slice thickness.

In step S602, time-series data of the three gradient magnetic field waveforms in the case of imaging according to the imaging sequence is acquired.

In step S603, time-series data of each gradient magnetic field waveform is Fourier transformed, and frequency component data of each gradient magnetic field waveform is calculated.

In step S604, the amount of heat generated in the entire imaging sequence is estimated from the amount of heat generated per unit time and imaging time information, based on frequency component data of each gradient magnetic field waveform calculated in step S603, by using the transfer function and the imaging time information relating to heat generation with respect to each of the gradient magnetic field waveforms of Gx, Gy, and Gz actually measured in advance. By storing the above results in the heat generation amount database, the heat generation amount database can be generated and the amount of generated heat can be calculated according to the imaging conditions.

Next, an example of the transfer function used for calculating the amount of generated heat in step S604 will be described with reference to FIG. 7.

Figure 7:
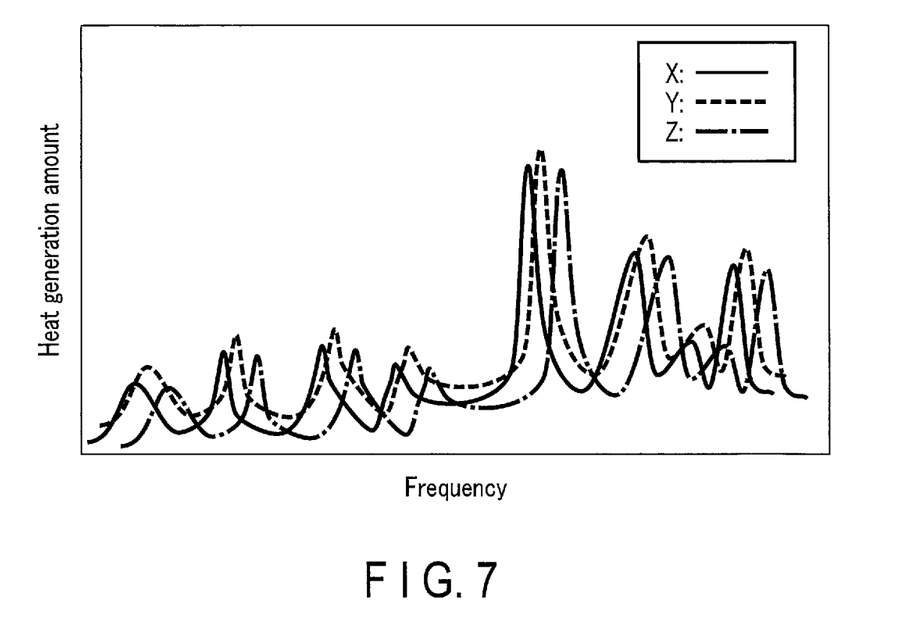
FIG. 7 is a diagram showing one example of a transfer function according to the present embodiment.

FIG. 7 is a graph showing the amount of generated heat for each of the frequency components of the three gradient magnetic fields of Gx, Gy, and Gz. The vertical axis shows the amount of generated heat, and the horizontal axis shows the frequency components. The solid line shows the calorific value related to the gradient magnetic field of Gx, the broken line shows the calorific value related to the gradient magnetic field of Gy, and the alternate long and short dashed line shows the calorific value related to the gradient magnetic field of Gz.

The transfer function for each of the three gradient magnetic fields is obtained by measuring a relation of a superconducting coil and the amount of heat heating a support structure of the superconducting coil with respect to the frequency component at the time, for example, when the MRI apparatus 1 is installed or when a gradient magnetic field is applied in advance at the time of shipment of the MRI apparatus 1. In order to calculate the transfer function, the amount of generated heat with respect to the imaging condition assumed in an actual imaging, may be calculated in advance.

If the types of imaging sequences are the same, typical imaging conditions such as the TR, the number of slices, and the spatial resolution have a simple correlation with the amount of heat generated. Therefore, by determining a reference imaging condition for each imaging sequence and actually measuring the amount of heat generated at the time of imaging under the determined imaging condition, the limit imaging condition under which imagings can be performed in a state with no risk of quenching can also be determined by making a comparison with the reference imaging condition.

In addition, the processing circuitry 131 may present, through the presentation function 1329, information calculated through the flowcharts shown in FIGS. 2 and 4 to an operator.

An example of presenting information to an operator will be described with reference to FIG. 8.

Figure 8:
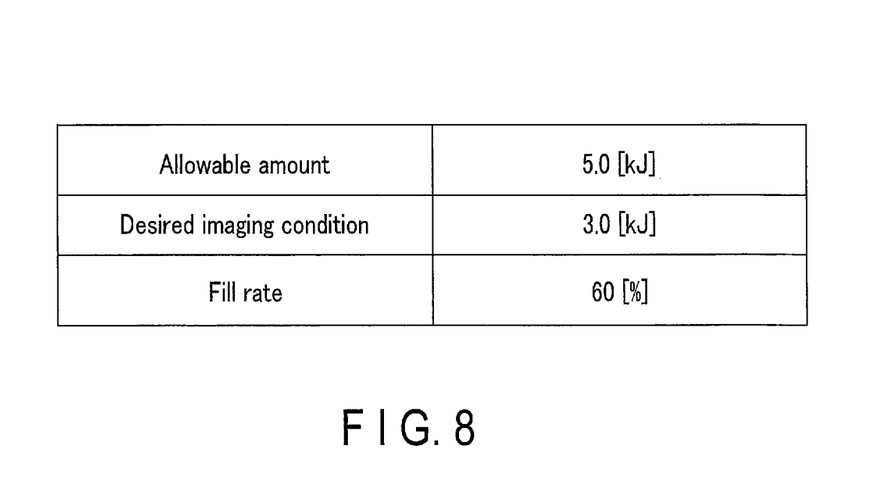
FIG. 8 is a diagram showing an example of presenting information to an operator according to the present embodiment.

FIG. 8 is an example of information displayed on the display 127 of the MRI apparatus 1, an operation terminal of an operator, and an external device, and may be displayed together with, for example, an imaging parameter setting screen. FIG. 8 shows the allowable amount for an imaging, the feature amount estimated based on the desired imaging condition, and the satisfaction rate of the feature amount with respect to the allowable amount. In the example of FIG. 8, since the sufficiency rate is 60%, by grasping this information, an operator can recognize that there is a margin up to the allowable amount and thus a more favorable desired imaging condition is settable.

The imaging management processing according to the present embodiment may be set in the MRI apparatus 1 by default, or an operator may be able to switch between a normal mode and the imaging management mode according to the present embodiment. For example, in the case where an imaging of, e.g., a patient in a serious medical emergency is ordered and a high-quality imaging is desired for the patient under a favorable imaging condition without considering subsequent imagings, this imaging can be performed without any limit on the amount of generated heat by switching to the normal mode.

For example, a button for switching between the normal mode and the imaging management mode according to the present embodiment may be arranged on the imaging condition setting screen so that an operator can switch from the imaging management mode to the normal mode by touching or clicking the button. In the case of switching from the imaging management mode to the normal mode, an operator may be prompted to make confirmation by displaying a confirmation screen including a message such as "There is a risk that a future imaging will no longer be possible or the imaging condition will deteriorate. Continue?"

Next, the simulation results by the MRI apparatus that manages imaging according to the present embodiment will be described with reference to FIGS. 9A and 9B.

Figure 9A:
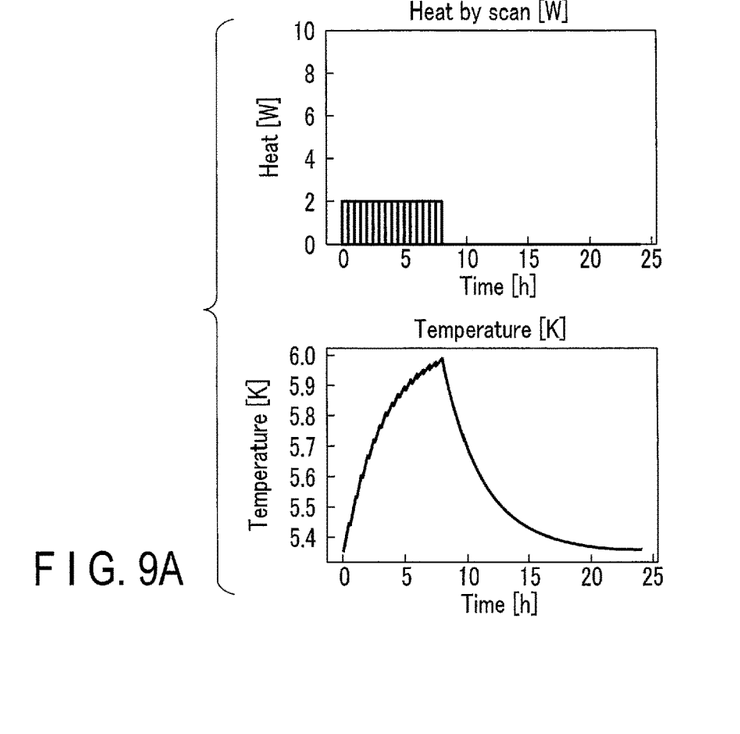
FIG. 9A is a diagram showing a first example of a simulation result by the MRI apparatus that performs imaging management according to the present embodiment.
Figure 9B:
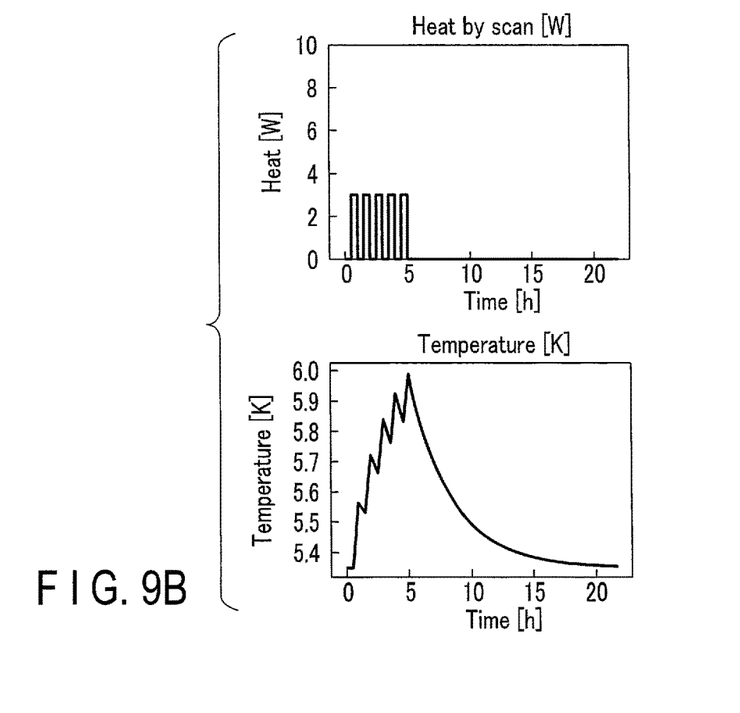
FIG. 9B is a diagram showing a second example of a simulation result by the MRI apparatus that performs imaging management according to the present embodiment.

FIG. 9A and FIG. 9B assume that simulations are performed using the MRI apparatus having a superconducting magnet of a conduction cooling type, and show the example of the amount of input heat and the temperature change in each imaging sequence in the case where 16 cases are examined in one day.

Specifically, it is assumed that 16 people are examined while a target period is one day (24 hours), imaging for 25 minutes is performed once per person during the daytime, and the rest time is five minutes. In addition, it is assumed an imaging schedule is such that an imaging is not performed for 16 hours during the nighttime. It is assumed that the thermal equilibrium temperature is 5.35 [K] and the critical temperature at which the risk of quenching increases is 6 [K]. The upper part of FIG. 9A shows the amount of heat [W] per unit time, and the lower part of FIG. 9A shows the temperature change in the superconducting coil and the structure supporting the superconducting coil.

As shown in FIG. 9A, imaging management with the MRI apparatus 1 according to the present embodiment can set the imaging conditions in such a manner as to evenly distribute the amount of heat generated in the examinations of 16 cases in one day. This makes it possible to set the imaging condition for the heat amount of 1.4 [W]×25 [minutes]=2.1 [kJ] per examination from the first scanning.

FIG. 9B shows a case assuming that simulations are performed using the MRI apparatus having a superconducting magnet of a conduction cooling type, as in FIG. 9A. FIG. 9B shows an example of the amount of input heat and the temperature change in each scanning in a case in which a relatively intensive examination (examination that generates a large amount of heat) is performed for five cases on one day and is performed while setting intervals between imagings. Specifically, an assumed imaging pattern is that five people are examined while an assumed period is one day (24 hours), imaging is performed for 25 minutes once per person during the daytime, the rest time is 35 minutes, and imaging is not performed for 16 hours during the nighttime. As in FIG. 9A, it is assumed that the thermal equilibrium temperature is 5.35 [K] and the critical temperature at which the risk of quenching increases is 6 [K].

As shown in FIG. 9B, imaging management with the MRI apparatus 1 according to the present embodiment can set the imaging conditions in such a manner as to evenly distribute the amount of heat generated in the examinations of 16 cases in one day. This makes it possible to set the imaging condition for the heat amount of 3.0 [W]×25 [minutes]=4.5 [kJ] per examination from the first scanning.

Figure 10A:
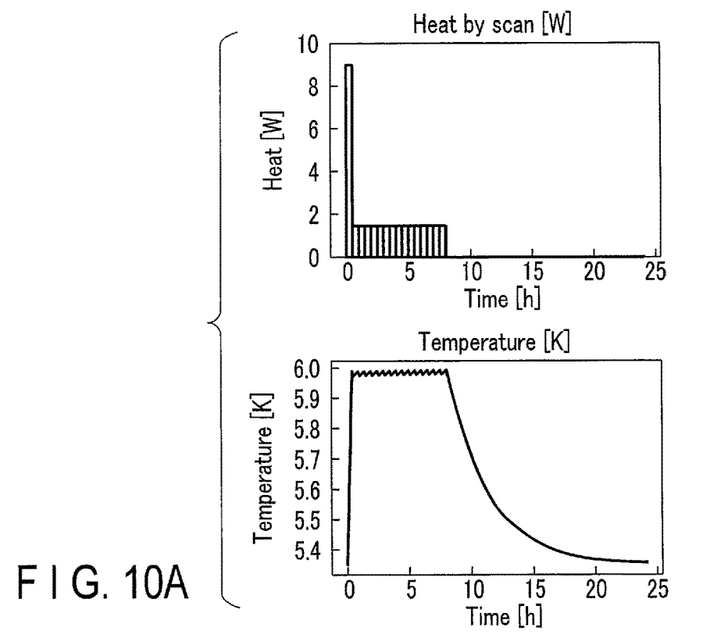
FIG. 10A is a diagram showing a first example of a simulation result by a conventional MRI apparatus that serves as a comparative example.
Figure 10B:
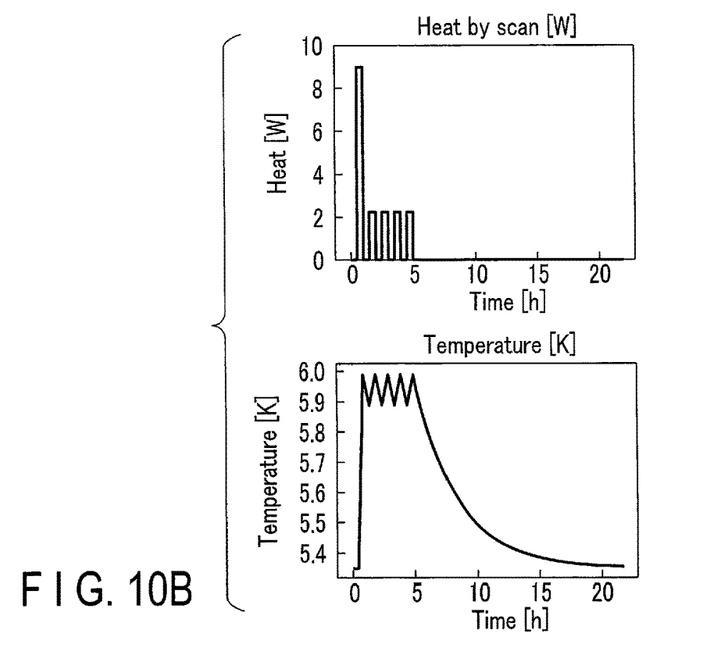
FIG. 10B is a diagram showing a second example of a simulation result by the conventional MRI apparatus that serves as a comparative example.

Next, as a comparative example, FIG. 10A and FIG. 10B show the simulation results by the conventional method in which imaging management is not performed.

The conditions for the simulations in FIGS. 10A and 10B are the same as those in FIGS. 9A and 9B, respectively. As shown in FIG. 10A, the conventional method allows imaging that generates heat up to the amount of 9.0 [W]×25 [minutes]=13.5 in the first imaging in such a manner as to reach the critical temperature of 6 [K] with only one imaging for 25 minutes. If imaging is performed under the imaging condition in which the limit amount of heat is reached as described in the above, the internal temperature will approximate 6 [K] in the first imaging. Thus, in examinations of the second and subsequent cases, in order to avoid the risk of quenching, the amount of heat allowed to be generated is only 1.287 [W]×25 [minutes]=1.93 [kJ].

Also in FIG. 10B, imaging that generates heat up to the amount of 13.5 [kJ] can be performed in the first image; however, if imaging is performed under this condition, the internal temperature will approximate 6 [K] in the first image. In the examinations of the second and subsequent cases, in order to avoid the risk of quenching, the amount of heat allowed to be generated is only 2.385 [W]×25 [minutes]=3.58 [kJ].

According to the present embodiment described in the above, the allowable amount of heat is calculated for a plurality of imagings in a target period, and the imagings are prompted to be executed under the imaging condition in which the amount of heat generated in each imaging is smaller than the allowable amount. This makes it possible to consider the pace distribution of imaging in a plurality of imagings, to execute a high-quality imaging on average, and to increase the quality of all imagings in a target period. This further decreases the risk of quenching and enables efficient imaging to be performed without unnecessary redoing such as resetting of an imaging condition.

According to the modification of the present embodiment, in each imaging, it is possible to prompt an operator to input an imaging condition within the range of the allowed amount. This eliminates or decreases redoing of an imaging or resetting of a condition, thereby enabling examination to be performed with efficiency.

Furthermore, by displaying information that serves as a guide for the determination of an imaging condition when the imaging condition is input, the operator can quickly determine with confidence the imaging condition without concern for quenching caused by heat generation. In addition, by setting an upper limit on the total number of imagings in a target period and limiting the input in such a manner as to not accept an imaging beyond a number of times that exceeds the cooling capability, the number of examinations performable in a target period can be recognized at an early stage, thereby enabling efficient planning of examinations. That is, according to the present embodiment, in the field of clinical examination, operations such as reasonable adjustment of examination appointments can be carried out with efficiency.

According to at least one embodiment described in the above, efficient examinations can be supported while ensuring quality.

In addition, each function according to the embodiment can also be realized by installing a program for executing the process on a computer such as a workstation and loading it into a memory. The program that causes the computer to execute the processing can be stored and distributed by means of a storage medium, such as a magnetic disk (a hard disk, etc.), an optical disk (CD-ROM, DVD, Blu-ray (registered trademark) etc.), and a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising: processing circuitry configured to:
    acquire a target period and imaging information including information of a plurality of imagings, each including a corresponding imaging sequence, scheduled during the target period;
    calculate an allowable amount of heat input to a superconducting magnet, and calculate a corresponding allowable amount of heat allocated to each of the plurality of imagings scheduled during the target period; and
    determine an imaging condition based on the corresponding allowable amount of heat in each of the plurality of imagings.

2. The magnetic resonance imaging apparatus according to claim 1, wherein the processing circuitry is further configured to:
    accept a desired imaging condition desired by an operator;
    estimate a feature amount relating to heat input to the superconducting magnet when an imaging is performed under the accepted desired imaging condition; and
    determine the desired imaging condition as the imaging condition, when the feature amount is equal to or smaller than the allowable amount of heat.

3. The magnetic resonance imaging apparatus according to claim 2, wherein the processing circuitry is further configured to limit an input value of an imaging parameter relating to the desired imaging condition desired by the operator, based on the allowable amount of heat.

4. The magnetic resonance imaging apparatus according to claim 2, wherein the processing circuitry is further configured to present the allowable amount of heat to the operator.

5. The magnetic resonance imaging apparatus according to claim 4, wherein the processing circuitry is further configured to present the feature amount and a fill rate of the feature amount with respect to the allowable amount of heat.

6. The magnetic resonance imaging apparatus according to claim 1, wherein the processing circuitry is further configured to calculate the corresponding allowable amount of heat to be allocated to each of the plurality of imagings, based on an amount of coolable heat during the target period.

7. The magnetic resonance imaging apparatus according to claim 1, wherein the processing circuitry is further configured to average the allowable amount of heat to determine an average amount and allocate the average amount to each of the plurality of imagings.

8. The magnetic resonance imaging apparatus according to claim 1, wherein the processing circuitry is further configured to allocate a value weighted according to an amount of heat generated in each of the plurality of imagings as the corresponding allowable amount of heat to each of the plurality of imagings.

9. The magnetic resonance imaging apparatus according to claim 1, wherein the processing circuitry is further configured to calculate a maximum number of imagings based on an amount of coolable heat during the target period.

10. An imaging management method, comprising:
acquiring a target period and imaging information including information of a plurality of imagings, each including a corresponding imaging sequence, scheduled during the target period;
calculating an allowable amount of heat input to a superconducting magnet, and calculating a corresponding allowable amount of heat allocated to each of the plurality of imagings scheduled during the target period; and
determining an imaging condition based on the corresponding allowable amount of heat in each of the plurality of imagings.

11. The magnetic resonance imaging method according to claim 10, further comprising:
accepting a desired imaging condition desired by an operator;
estimating a feature amount relating to heat input to the superconducting magnet when an imaging is performed under the accepted desired imaging condition; and
determining the desired imaging condition as the imaging condition when the feature amount is equal to or smaller than the allowable amount of heat.

12. The magnetic resonance imaging method according to claim 11, further comprising limiting an input value of an imaging parameter relating to the desired imaging condition desired by the operator, based on the allowable amount of heat.

13. The magnetic resonance imaging method according to claim 11, further comprising presenting the allowable amount of heat to the operator.

14. The magnetic resonance imaging method according to claim 13, wherein the presenting step further comprises presenting the feature amount and a fill rate of the feature amount with respect to the allowable amount of heat.

15. The magnetic resonance imaging method according to claim 10, wherein the calculating step further comprises calculating the corresponding allowable amount of heat to be allocated to each of the plurality of imagings, based on an amount of coolable heat during the target period.

16. The magnetic resonance imaging method according to claim 10, further comprising averaging the allowable amount of heat to determine an average amount and allocating the average amount to each of the plurality of imagings.

17. The magnetic resonance imaging method according to claim 10, further comprising allocating a value weighted according to an amount of heat generated in each of the plurality of imagings as the corresponding allowable amount of heat to each of the plurality of imagings.

18. The magnetic resonance imaging method according to claim 10, further comprising calculating a maximum number of imagings based on an amount of coolable heat during the target period.

19. A magnetic resonance imaging apparatus, comprising:
processing circuitry configured to
calculate an allowable amount of heat input to a superconducting magnet, the allowable amount being allocated to each of a plurality of imagings scheduled during a target period; and
determine an imaging condition based on the allowable amount in the each of the plurality of imagings,
wherein the processing circuitry is further configured to limit an input value of an imaging parameter relating to a desired imaging condition desired by an operator, based on the calculated allowable amount of heat.

* * * * *